United States Patent [19]

Wagoner

[11] Patent Number: 4,914,542
[45] Date of Patent: Apr. 3, 1990

[54] CURRENT LIMITED REMOTE POWER CONTROLLER

[75] Inventor: Robert G. Wagoner, Troy, Ohio

[73] Assignee: Westinghouse Electric Corp., Pittsburgh, Pa.

[21] Appl. No.: 290,661

[22] Filed: Dec. 27, 1988

[51] Int. Cl.$^4$ .................................... H02H 3/087
[52] U.S. Cl. .................................... 361/98; 361/101; 361/18; 323/277
[58] Field of Search ............... 361/87, 93, 98, 107, 361/18; 330/2.7 P, 294; 323/274, 775, 276, 297

[56] References Cited

U.S. PATENT DOCUMENTS

| | | | |
|---|---|---|---|
| 4,227,098 | 10/1980 | Brown et al. | 307/311 |
| 4,404,473 | 9/1983 | Fox | 361/93 |
| 4,595,966 | 6/1986 | Huber et al. | 361/98 X |
| 4,638,396 | 1/1987 | Mukli et al. | 361/93 X |
| 4,724,374 | 2/1988 | Beg | 323/272 |
| 4,799,126 | 1/1989 | Kruse et al. | 361/101 |
| 4,816,963 | 3/1989 | Eden | 361/101 |

Primary Examiner—Derek S. Jennings
Attorney, Agent, or Firm—R. P. Lenart

[57] ABSTRACT

Remote power controllers for controlling power between an external power supply and a load include output stages including MOSFETs and a drive circuit connected to supply gate voltage of a preselected magnitude to each of the MOSFETs in response to a control signal. The magnitude of the gate voltage corresponds to a predetermined maximum drain current for each of the MOSFETs, with the maximum drain current being substantially constant over the expected operating temperature range of the power controller. An overload signal representative of excessive power dissipation in the MOSFETs is sensed and a trip signal is produced when that overload signal exceeds a threshold limit. The drive circuit responds to the trip signal to remove the gate voltage signal from the MOSFETs.

15 Claims, 4 Drawing Sheets

CURRENT LIMITED REMOTE POWER CONTROLLER

BACKGROUND OF THE INVENTION

This invention relates to remote power controllers which are used to control loads in a power distribution system, and more particularly, to such controllers which limit the current to a specific level in the case of an overload.

Remote power controllers have used bipolar transistors to limit fault currents in circuits of power distribution systems. One current limiting technique limits the base current to a level which allows the transistor to pull out of saturation when the collector current reaches a level proportional to the product of the gain of the transistor multiplied by the base current. The gain of a bipolar transistor varies considerably over temperature and from device to device, thereby requiring sensing circuits to adjust for different conditions. An alternative technique senses the load current and adjusts the base current of the transistor accordingly. These techniques have the drawback that bipolar transistors will not limit current instantaneously and current surges well beyond the current limit level can occur. Typically, the worst response occurs when a short circuit is applied while full rated load current is flowing.

Some remote power controllers depend upon the inductance of the transmission line in the distribution system to limit the rise time of the current. However, low values of transmission line inductance lead to high peak currents which occur before the bipolar transistors and control circuitry can react to limit the current. Since transmission line inductance is indeterminate and could be almost zero in certain distribution systems, this is not an effective method of limiting current.

In order to take advantage of the relatively high gain, good temperature stability, high input impedance and freedom from second breakdown exhibited in more recently developed field effect transistors, a DC power controller which uses an FET as the switching element was designed and is disclosed in U.S. Pat. No. 4,404,473, issued Sept. 13, 1983. Overcurrent protection in that power controller was achieved by turning off the FET gate voltage signal in response to a predetermined magnitude of load current. A time delay was introduced between the time that the predetermined magnitude of load current was reached and the time that gate drive signal was removed to turn off the FET. The gate of the FET is driven with a voltage such that the device will not limit current to a level below its rated maximum value. This permits a current surge prior to turn-off of the FET. The resulting current surge, occurring between the time that the fault occurs and the time that the control circuit removes the gate voltage, may destroy the FET.

It is therefore desirable to construct a remote power controller which limits fault currents to a specific maximum magnitude and is not subject to the fault current surges experienced in prior art power controllers.

SUMMARY OF THE INVENTION

Power controllers constructed in accordance with this invention include a pair of terminals for connection to an external power source and a load, and one or more metal oxide semiconductor field effect transistors (MOSFETs) in a power stage connected between the terminals. For DC applications, each MOSFET drain is connected to one of the terminals and each source is connected to the other terminal. For AC applications, two MOSFETs are connected in series in each power stage. A drive circuit is connected to supply gate voltage having a preselected magnitude to each of the MOSFETs gates in response to a control signal, thereby turning on the MOSFETs. The gate signal has a preselected magnitude which corresponds to a maximum drain current for each of the MOSFETs, with that maximum drain current being substantially constant over an expected operating temperature range of the power controller.

A trip signal is produced in response to the presence of an overload condition, to turn off the MOSFETs. In one embodiment, a voltage sensing circuit senses the source to drain voltage of the MOSFETs and the trip signal is produced when that voltage exceeds a predetermined magnitude. In a second embodiment, the trip signal is produced in response to a predetermined magnitude of load current. In each case, the drive circuit responds to the trip signal by removing the gate voltage from the MOSFETs gates. This invention also encompasses the method of current limiting performed by the above power controller circuits.

MOSFETs, which are driven by a preselected gate voltage, limit current instantly and independently of transmission line inductance. This occurs even when a short is applied while full rated load current is flowing. MOSFETs also have very low power requirements, can function with simple control and drive circuitry, and can provide easily controllable load current rise and fall times.

BRIEF DESCRIPTION OF THE DRAWINGS

The invention will be more easily understood by reference to the following drawings which illustrate the preferred embodiment, by way of example only, wherein.

DESCRIPTION OF THE PREFERRED EMBODIMENT

Figure 1:
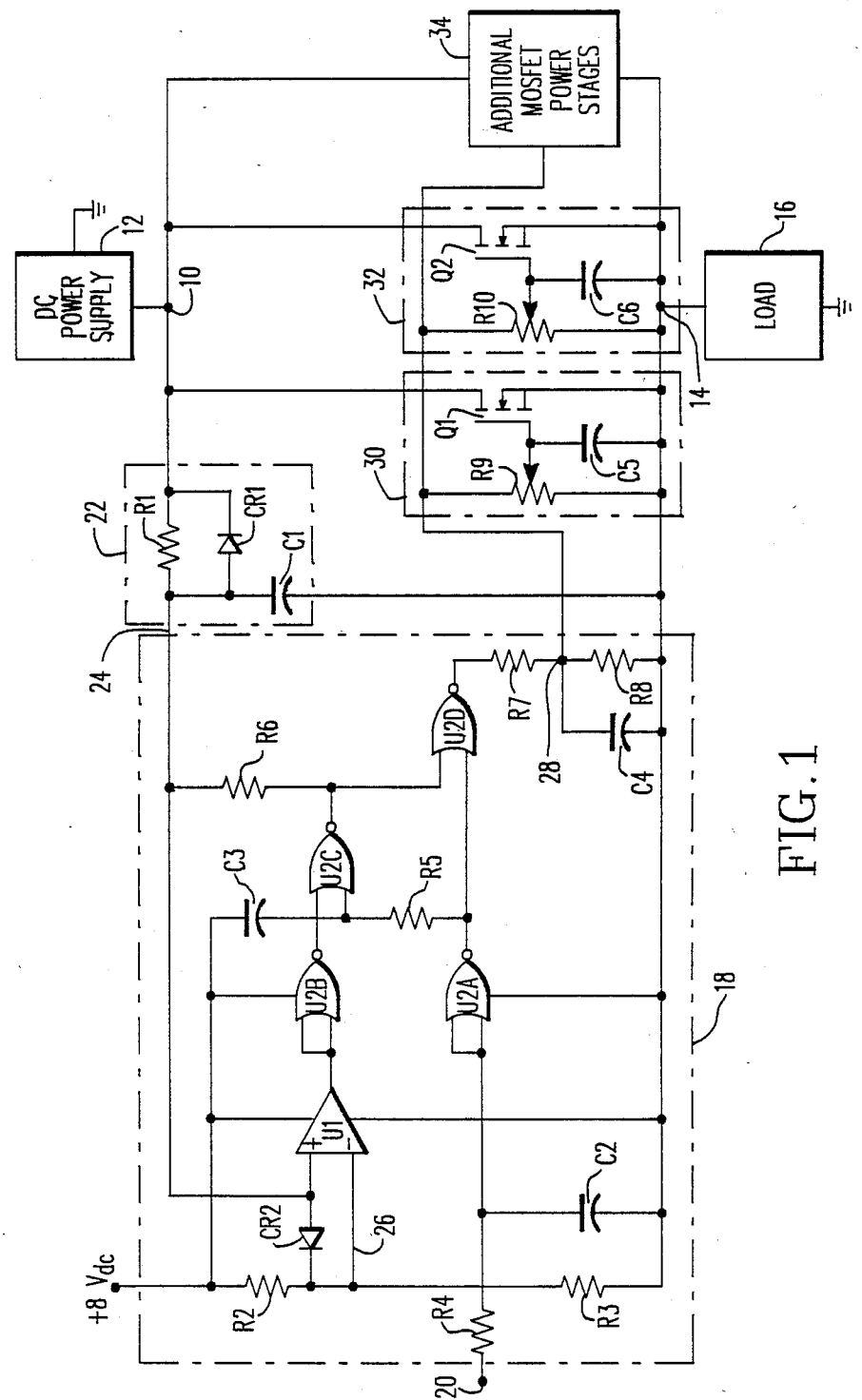
FIG. 1 is a schematic diagram of a current limited DC remote power controller constructed in accordance with one embodiment of this invention.

Referring to the drawings, FIG. 1 is a schematic diagram of a current limited DC remote power controller constructed in accordance with this invention. The power controller includes a first terminal 10 for connection to a external DC power supply 12 and a second terminal 14 for connection to an external load 16. A plurality of MOSFETs Q1 and Q2 each include a drain connected to terminal 10, a source connected to terminal 14 and a gate electrode. A drive circuit 18 is connected to supply a gate voltage signal having a preselected magnitude to each of the gates of the MOSFETs in response to a control signal applied to terminal 20. The gate voltage signal corresponds to a predetermined maximum drain current for each of the MOSFETs. This maximum drain current is substantially constant over an expected operating temperature range.

In order to protect the MOSFETs under conditions of excessive power dissipation, a sensing circuit 22 comprising resistor R1, diode CR1 and capacitor C1 monitors the drain to source voltage of the MOSFETs and produces a voltage indicating signal on line 24 which is representative of the monitored drain to source voltage. This voltage indicating signal is compared by comparator U1 to a reference voltage on line 26, which is established by a voltage divider formed by resistors R2 and R3. When the voltage on line 26 exceeds that on line 24 and a logic high control signal is supplied on terminal 20, a gate drive voltage signal appears on junction point 28 between resistors R7 and R8. This gate drive voltage signal is used to turn on the FETs in power stages 30, 32 and 34. In power stage 30, the gate voltage signal is transmitted to the gate of MOSFET Q1 through potentiometer R9. In power stage 32, a second potentiometer R10 is used to adjust the gate voltage on MOSFET Q2 to a preselected value. Additional MOSFET power stages 34 may be added in parallel with circuit stages 30 and 32 to increase the current handling capability of the controller.

When the drain to source voltage of the MOSFETs reaches a predetermined magnitude, the MOSFETs are dissipating excessive power and the voltage on line 24 exceeds that of line 26. This causes the output of comparator U1 to go high, thereby creating a high input to NOR gate U2B. Acting through NOR gate U2C, this inhibits the output of NOR U2D and removes the gate voltage signal at junction point 28, thereby turning off the MOSFETs.

Figure 2:
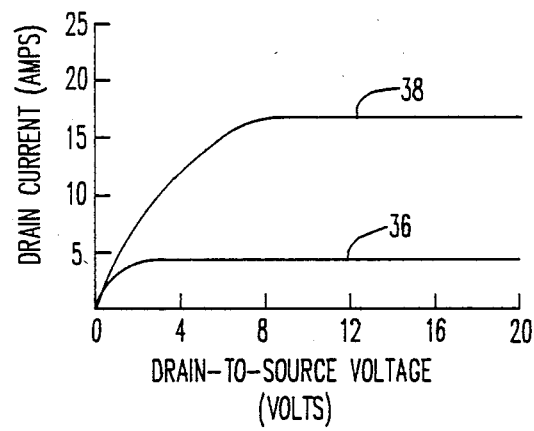
FIG. 2, 3 and 4 are curves which illustrate the operating parameters of the MOSFETs used in the circuit of FIG. 1.
Figure 3:
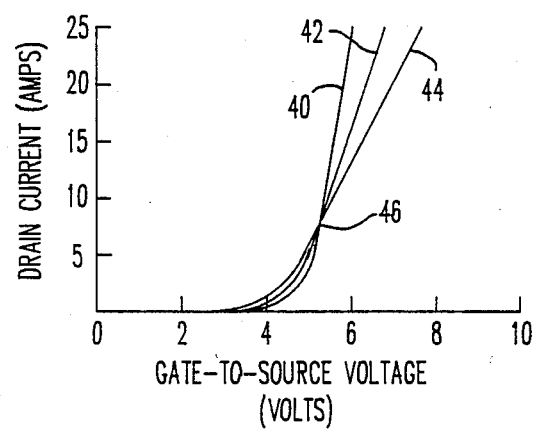
Figure 4:
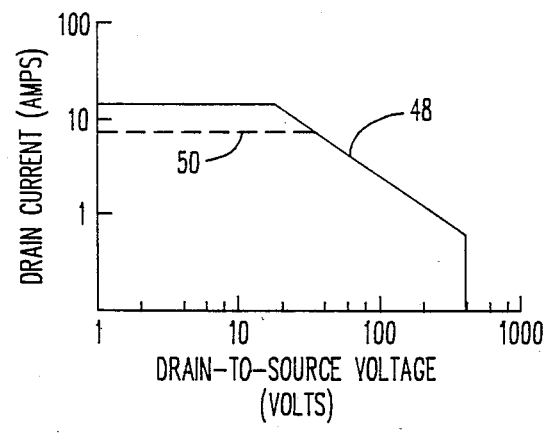

FIGS. 2, 3 and 4 illustrate the operating parameters of Motorola MOSFETs type MTM15N40, which may be used in the power stages of the remote power controller of FIG. 1. FIG. 2 illustrates the relationship between drain to source voltage and drain to source current for particular gate to source voltages. Curve 36 represents a 5 volt gate voltage and curve 38 represents a 6 volt gate voltage. From these curves it is apparent that for a given level of gate voltage, the load current is limited to a specific level.

FIG. 3 shows the relationship between the gate to source voltage and drain current of the same MOSFETs at various operating temperatures. Curve 40 represents an operating temperature of −55° C., curve 42 represents an operating temperature of 25° C. and curve 44 represents an operating temperature of 100° C. From these curves, it is apparent that with a gate voltage of approximately 5.4 volts, the current limit level remains substantially constant at approximately 8 amps over the entire operating temperature range. This is illustrated by point 46 in FIG. 3. Therefore, by using a gate voltage of about 5.4 volts, the current limit level established by this device will be substantially constant as the junction temperature changes.

FIG. 4 shows the safe operating area for MOSFETs MTM15N40 as the area under curve 48. Operation beyond the points defined by curve 48 results in excessive power dissipation which will cause destruction of the MOSFETs if permitted to continue. Published safe operating area curves are readily available and define the acceptable operating times above the DC curve illustrated in FIG. 4. With a current limit set at approximately 8 amps as illustrated by line 50, it is apparent that a trip circuit with an inverse voltage time delay is required if the drain to source voltage can exceed about 30 volts.

A circuit has been constructed in accordance with FIG. 1 which included a bank of MOSFETs in parallel, each limiting its individual current to 8 amps. By paralleling MOSFETs in this manner, any current level desired in 8 amp increments can be obtained. By varying the nominal gate voltage slightly, for example by adjusting potentiometer R10 in FIG. 1, the current limit level can be fine tuned to an exact level.

By using other types of MOSFETs, increment levels other than 8 amps can be set. For example, for Motorola type MTM8N20 MOSFETs, the transfer characteristic is approximately the same over the temperature range at a gate voltage of approximately 6.1 volts. At that gate voltage, the current limit level is approximately 6 amps. Therefore, using this type of device can provide current limit levels in increments of six amps.

Figure 5:
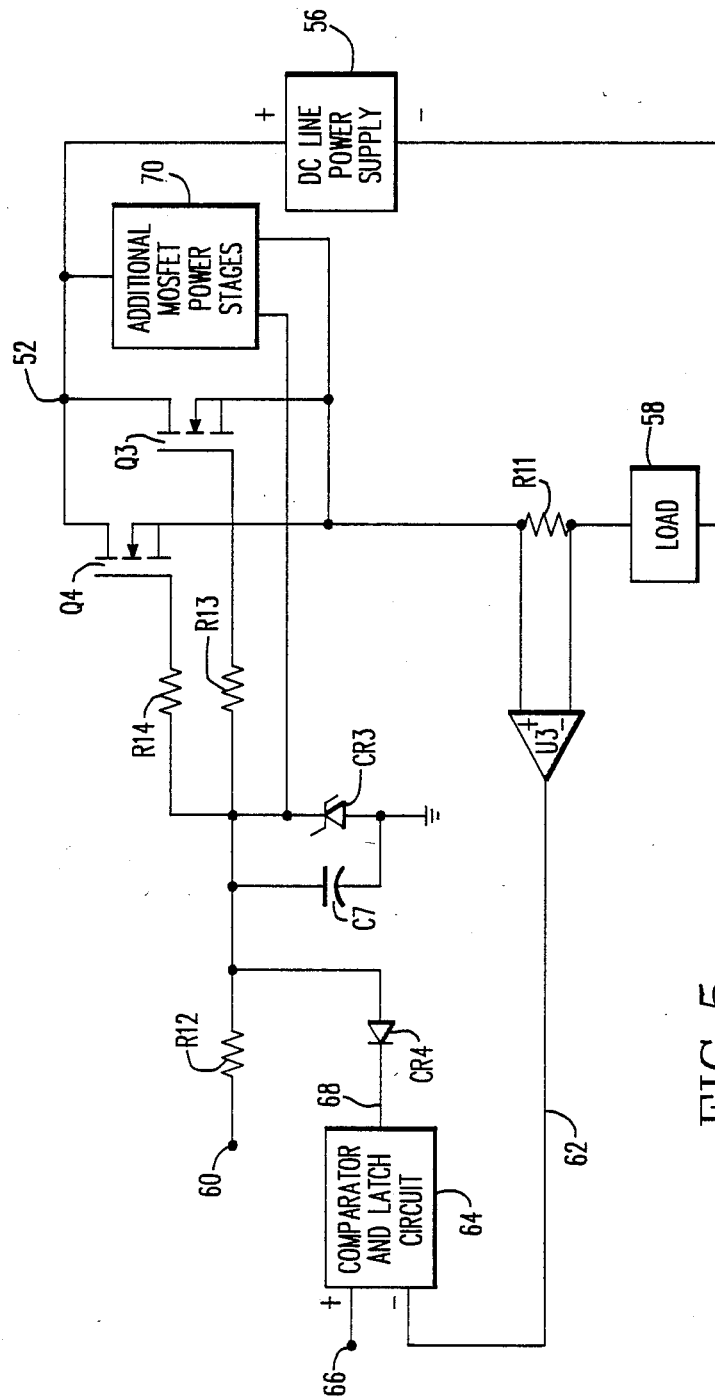
FIG. 5, a schematic diagram of a current limited DC remote power controller constructed in accordance with an alternative embodiment of this invention.

FIG. 5 is a simplified schematic diagram of a current limited DC remote power controller constructed in accordance with an alternative embodiment of this invention. In this embodiment, one or more MOSFETs Q3 and Q4 are electrically connected in parallel with each other between terminals 52 and 54. An external DC line power supply 56 supplies power to terminal 52. A load 58 is connected through a shunt resistor R11 to terminal 54. A turn-on signal supplied to terminal 60 is used to provide gate voltage via resistors R12, R13 and R14 to gates of transistors Q3 and Q4. A zener diode CR3 limits the gate voltage supplied to the transistors, thereby limiting the maximum available current to the load 58. A signal proportional to the load current is amplified by amplifier U3 and fed via line 62 to the negative input of comparator 64. There it is compared with a reference voltage signal supplied on terminal 66. As long as the current indicating signal on line 62 is less than the reference voltage signal on terminal 66, the output of comparator 64 at line 68 stays at a logic high level and transistors Q3 and Q4 remain on. When the current indicating signal on line 62 exceeds the reference signal at terminal 66, the output of comparator 64 goes low and latches low, thereby pulling down the gate voltages of transistors Q3 and Q4 through diode CR4. Capacitor C7 adds a slow ramp to the turn-off and turn-on sequence. C7 also reduces transients in the current limit level during fault conditions by keeping the gate voltage steady. Additional power stages 70 may be added to provide greater current handling capability.

A circuit has been constructed in accordance with FIG. 5 using type IXTM26N50 MOSFETs. The test circuit was a 5 amp, 270 volt solid state DC power controller which was set to continuously conduct a 5 amp load current and to trip as quickly as possible at a 10 amp load current. Tripping at 10 amps occurred within a few microseconds. The turn-on and turn-off ramp times were set by the time constants established by resistors R13 and R14, capacitor C7, and the gate capacitances of the transistors. The gate voltage was set a 6 volts to limit the fault current to about 16 amps until the overcurrent trip circuit could respond.

When the circuit was turned on into a shorted load, the current ramped up to 10 amps and then ramped back down to zero, all in about 250 microseconds. When the circuit was on and supplying about 5 amps to a load and the load was then shorted, the current increased to the current limit of 16 amps and then ramped down to zero in about 105 microseconds.

Figure 6:
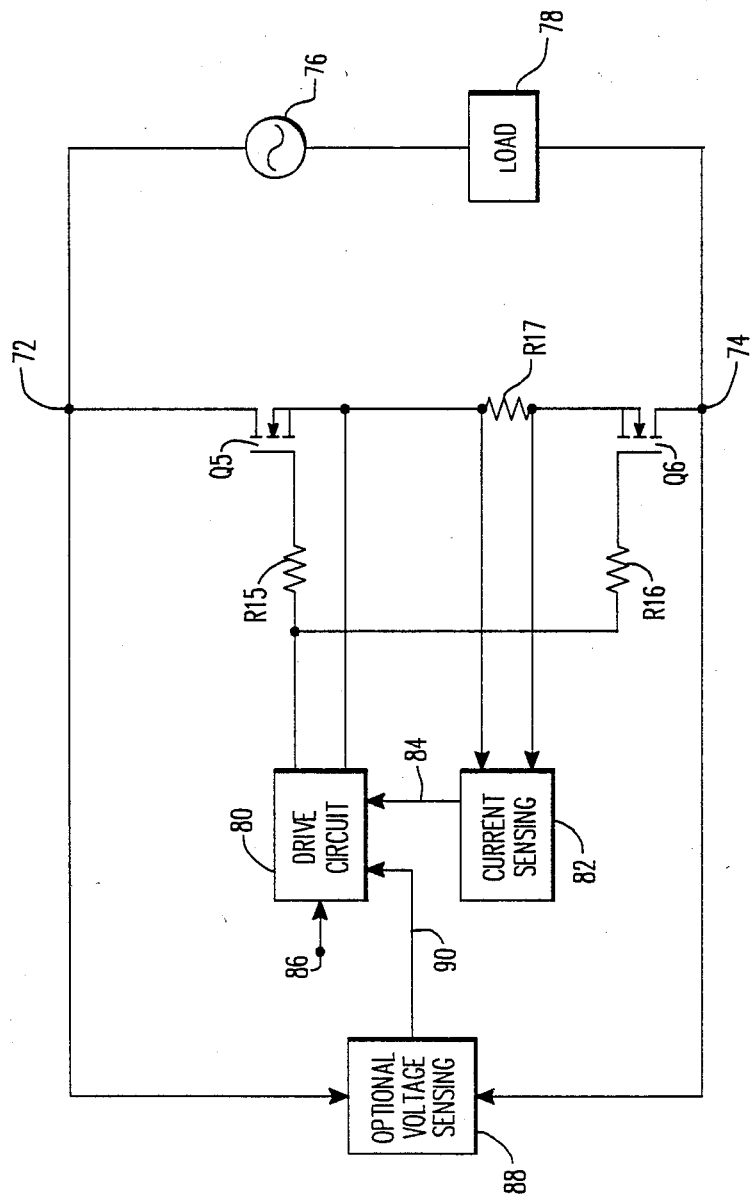
FIG. 6 is a schematic diagram of a current limited AC remote power controller constructed in accordance with another alternative embodiment of this invention.

FIG. 6 is a schematic diagram of a current limited AC remote power controller constructed in accordance with another alternative embodiment of this invention. In this embodiment, a pair of MOSFETs Q5 and Q6 are electrically connected in series with each other between a pair of terminals 72 and 74. An external AC power supply 76 and a load 78 are also connected to these terminals. A drive circuit 80 supplies gate voltage to MOSFETs Q5 and Q6 through resistors R15 and R16, respectively. Current flow through the MOSFETs is sensed by current sensing circuit 82 as a voltage across resistive shunt R17. Current sensing circuit 82 then produces a current indicating signal on line 84 which is compared by the drive circuit to a reference input voltage signal supplied on terminal 86. An indication of an overload condition in the MOSFETs can also be supplied by an optional voltage sensing circuit 88 which senses the voltage appearing between terminals 72 and 74 to produce a voltage indicating signal on line 90 which can then be compared by the drive circuit to the reference signal on line 86. When the overload indicating signal on lines 84 or 90 exceeds the reference signal input at terminal 86, the drive circuit 80 removes the gate voltage signal from MOSFETs Q5 and Q6. Prior to that time, the gate voltage signal supplied by drive circuit 80 was selected to limit the maximum current through MOSFETs Q5 and Q6 as described above.

As illustrated in FIGS. 1 and 6, remote power controllers constructed in accordance with this invention do not require complex control and drive circuits. Because the MOSFETs inherently limit current, only switch voltage sensing or load current sensing is necessary to trip the circuit off to protect the MOSFETs from exceeding their safe operating area limits. In addition, the power required by the remote power controller circuit is low and can be obtained from the control input so that no separate control power source is required.

Remote power controllers constructed in accordance with this invention can easily control the load current rise and fall times. Since the gate of the MOSFETs looks like a capacitor, the rise and fall times of the gate voltage can be controlled by the impedance of the drive circuit. As the gate voltage changes so does the resistance of the MOSFETs. If the drive circuit impedance is high, the rise and fall times will be slow. In a DC circuit, slow rise and fall times help to eliminate electromagnetic interference transmitted by the distribution system. These slow rise and fall times are limited only by the requirement to operating in the safe operating area as illustrated in FIG. 4.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. A direct current power controller comprising'
a first terminal for connection to an external power supply;
a second terminal for connection to an external load;
a first MOSFET, having a drain connected to said first terminal, a source connected to said second terminal and a gate;
a drive circuit connected to supply a gate voltage signal having a preselected magnitude to said gate in response to a control signal, thereby turning on said first MOSFET, wherein said preselected magnitude of gate voltage signal corresponds to a predetermined maximum drain current for said MOSFET, said maximum drain current being substantially constant over an expected operating temperature range of the power controller;
means for producing an overload indicating signal representative of excessive power dissipation in said MOSFET; and
means for producing a trip signal when said overload indicating signal exceeds a predetermined magnitude, said drive circuit being responsive to said trip signal to remove said gate voltage signal from said gate.

2. A direct current power controller as recited in claim 1, further comprising:
a second MOSFET, having a drain connected to said first terminal, a source connected to said second terminal and a gate; and
wherein said drive circuit is further connected to supply said gate voltage signal to said gate of said second MOSFET and said drive circuit is responsive to said trip signal to remove said gate voltage signal from said gate of said second MOSFET.

3. A direct current power controller as recited in claim 1, wherein said means for producing a trip signal comprises:
a comparator connected to receive said overload indicating signal and a reference signal, said comparator producing said trip signal when said overload indicating signal exceeds said reference signal.

4. A direct current power controller as recited in claim 1, wherein said overload indicating signal comprises:
a voltage indicating signal representative of the drain to source voltage of said MOSFET.

5. A direct current power controller as recited in claim 1, wherein said overload indicating signal comprises:
a load current indicating signal representative of the total drain current of said MOSFET.

6. A method of controlling direct current, said method comprising the steps of:
providing a first terminal for connection to an external power supply;
providing a second terminal for connection to an external load;
providing a first MOSFET, having a drain connected to said first terminal, a source connected to said second terminal and a gate;
supplying a gate voltage signal to the gate of said MOSFET in response to a control signal, thereby turning on said MOSFET, said gate voltage signal having a preselected magnitude, wherein said preselected magnitude of the gate voltage signal corresponds to a preselected maximum drain current, said maximum drain current being substantially constant over an expected operating temperature range;
producing an overload indicating signal representative of excessive power dissipation in said MOSFET;
producing a trip signal when said overload indicating signal exceeds a predetermined magnitude; and
removing said gate voltage signal from said gate, in response to said trip signal.

7. A method of controlling direct current as recited in claim 6, wherein said overload indicating signal comprises:
   a voltage indicating signal representative of the drain to source voltage of said MOSFET.

8. A method of controlling direct current as recited in claim 6, wherein said overload indicating signal comprises:
   a load current indicating signal representative of the total drain current of said MOSFET.

9. An alternating current power controller comprising:
   a first terminal for connection to an external power supply;
   a second terminal for connection to an external load;
   a circuit branch electrically connected between said first and second terminals, said circuit branch including a pair of MOSFETs each having a main conduction path between a source and a drain and a gate, said main conduction paths being electrically connected in series with each other;
   a drive circuit connected to supply a gate voltage signal having a preselected magnitude to each of said gates in response to a control signal, thereby turning on said MOSFETs, wherein said preselected magnitude of gate voltage signal corresponds to a predetermined maximum drain current for each of said MOSFETs, said maximum drain current being substantially constant over an expected operating temperature range of the power controller;
   means for producing an overload indicating signal representative of excessive power dissipation in said MOSFETs; and
   means for producing a trip signal when said overload indicating signal exceeds a predetermined magnitude, said drive circuit being responsive to said trip signal to remove said gate voltage signal from said gates.

10. An alternating current power controller as recited in claim 9, wherein said means for producing a tip signal comprises:
    a comparator connected to receive said overload indicating signal and a reference signal, said comparator producing said trip signal when said overload indicating signal exceeds said reference signal.

11. An alternating current power controller as recited in claim 9, wherein said overload indicating signal comprises:
    a voltage indicating signal representative of the voltage between said first and second terminals.

12. An alternating current power controller as recited in claim 9, wherein said overload indicating signal comprises:
    a load current indicating signal representative of the current in the main current paths of said MOSFETs.

13. A method of controlling alternating current, said method comprising the steps of:
    providing a first terminal for connection to an external power supply;
    providing a second terminal for connection to an external load;
    providing a circuit branch electrically connected between said first and second terminals, said circuit connected branch including a pair of MOSFETs each having a main conduction path between a source and a drain and a gate, said main conduction paths being electrically connected in series with each other;
    supplying a gate voltage signal to the gates of said MOSFETs in response to a control signal, thereby turning on said MOSFETs, said gate voltage signal having a preselected magnitude, wherein said preselected magnitude of the gate voltage signal corresponds to a preselected maximum drain current, said maximum drain current being substantially constant over an expected operating temperature range;
    producing an overload indicating signal representative of excessive power dissipation in said MOSFETs;
    producing a trip signal when said overload indicating signal exceeds a predetermined magnitude; and
    removing said gate voltage signal from said gates, in response to said trip signal.

14. A method of controlling alternating current as recited in claim 13, wherein said overload indicating signal comprises:
    a voltage indicating signal representative of the voltage between said first and second terminals.

15. A method of controlling alternating current as recited in claim 13, wherein said overload indicating signal comprises:
    a load current indicating signal representative of the current in said main conduction paths of said MOSFETs.

* * * * *